US008570196B1

(12) United States Patent
Liu

(10) Patent No.: US 8,570,196 B1
(45) Date of Patent: Oct. 29, 2013

(54) SERIAL IMAGE DATA FORMAT AND METHOD AND APPARATUS FOR CONVERING IMAGE DATA FROM SERIAL TO PARALLEL

(75) Inventor: Chih-Min Liu, Tainan (TW)

(73) Assignee: Himax Imaging Limited, Tainan (TW)

( * ) Notice: Subject to any disclaimer, the term of this patent is extended or adjusted under 35 U.S.C. 154(b) by 104 days.

(21) Appl. No.: 13/439,123

(22) Filed: Apr. 4, 2012

(51) Int. Cl.
*H03M 9/00* (2006.01)

(52) U.S. Cl.
USPC .......................................... 341/100; 341/101

(58) Field of Classification Search
USPC .......... 341/100, 101; 345/173, 174, 175, 176, 345/177, 178, 179, 156, 123; 348/745, 744
See application file for complete search history.

(56) References Cited

U.S. PATENT DOCUMENTS

2008/0303754 A1* 12/2008 Murata et al. .................. 345/76

* cited by examiner

*Primary Examiner* — Joseph Lauture
(74) *Attorney, Agent, or Firm* — McClure, Qualey & Rodack, LLP

(57) ABSTRACT

A method for converting image data from serial to parallel is provided. The method has steps of: receiving serial data of an image into a line buffer according to a serial clock signal of the image, wherein the serial data at least comprises a frame start code, and a row start code; detecting the frame start code of the serial data in the line buffer to trigger a vertical synchronous signal of the image; and detecting the row start code of the serial data in the line buffer to trigger a horizontal synchronous signal of the image.

8 Claims, 5 Drawing Sheets

SERIAL IMAGE DATA FORMAT AND METHOD AND APPARATUS FOR CONVERING IMAGE DATA FROM SERIAL TO PARALLEL

BACKGROUND OF THE INVENTION

1. Field of the Invention

The present invention relates to serial-to-parallel image data conversion technology, and in particular relates to serial-to-parallel image data conversion technology without the use of external sampling clocks.

2. Description of the Related Art

The serial interface for transmitting and receiving serial data has become popular since it reduces the wiring or routing for buses, electromagnetic interference (EMI), and power consumption.

However, the processor and the base-band interface still have to use a parallel data format for processing, for example, image data. Therefore, an image data receiver requires an interface to convert serial data into parallel data. In addition, since the serial clock signal is not continuous, the interface has to be provided with an additional and external sampling clock signal to synchronize the received serial data. Skew between the sampling clock signal and the serial clock signal sometimes occurs, and leads to inaccurate data sampling.

A more robust apparatus or method for converting image data from serial to parallel is needed.

BRIEF SUMMARY OF THE INVENTION

A serial image data format, comprising: a frame start code, for indicating that frame data of an image has started; and a first row start code, following the frame start code, for indicating that the first row data of the image has started.

The present invention provides a serial image data format. The serial image data format comprises: a frame start code, for indicating that frame data of a frame of an image has started; and a first row start code, following the frame start code, for indicating that the first row data of a first row of the frame of the image has started.

The present invention also provides a method for converting image data from serial to parallel. This method comprises the steps of: receiving serial data of an image into a line buffer according to a serial clock signal of the image, wherein the serial data at least comprises a frame start code, and a row start code; detecting the frame start code of the serial data in the line buffer to trigger a vertical synchronous signal of the image; and detecting the row start code of the serial data in the line buffer to trigger a horizontal synchronous signal of the image.

The present invention also provides an apparatus for converting image data from serial to parallel. The apparatus comprises a line buffer, for receiving serial data of an image into a line buffer according to a serial clock signal of the image, wherein the serial data at least comprises a frame start code, and a row start code; and a code matching logic circuit, coupled to the line buffer, further comprising: a vertical synchronous signal generating unit for detecting the frame start code of the serial data in the line buffer to trigger a vertical synchronous signal of the image; and a horizontal synchronous signal generating unit for detecting the row start code of the serial data in the line buffer to trigger a horizontal synchronous signal of the image.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Data Format

Figure 1:
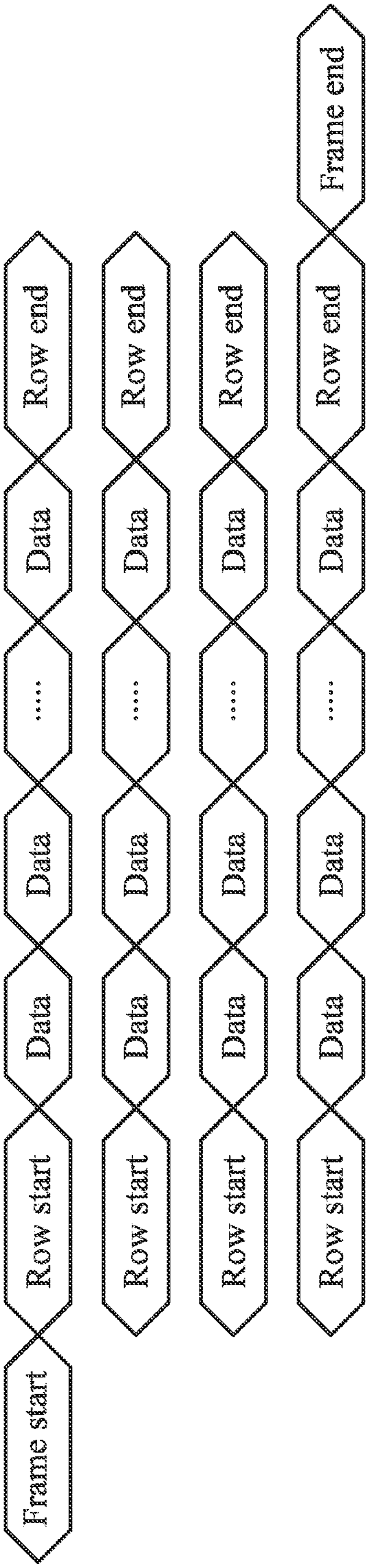
FIG. 1 shows a serial image data format according to an embodiment of the present invention.

A frame of an image has a plurality of rows, and each row has a plurality of pixels. In order to improve converting data from serial-to-parallel, the embodiments of the present invention have defined a new type of serial data format for the image. FIG. 1 shows the serial image data format of an embodiment of the present invention. For a frame of an image, the serial data format provided by the embodiment comprises a frame start code (labeled as “Frame start”) and a frame end (labeled as “Frame end”), respectively for indicating the start and the end of the frame data of the frame. In addition, between the frame start code and the frame end code in the image data, there is a plurality of row data, for example, a first row data, a second row data, a third row data, . . . , etc., and a last row data, where each row data has a plurality of pixel data. For the first row data, there is a first row start code and a first row end code, respectively for indicating the start and the end of the first row data. Similarly, for the last row data, there is a last row start code and a last row end code in the image data, respectively for indicating the start and the end of the last row data (Note that the row start codes and the row end codes for all rows in FIG. 1 are all labeled as “Row start” and “Row end”). As shown in FIG. 1, the first row start code follows the frame start code, the first row data follows the first row start code and is followed by the first row end code, the second row start code follows the first row end code, the second row data follows the second row start code and is followed by the second end code, etc. In the last row, the last row start code follows the previous row end code, the last row data follows the last row start code and is followed by the last row end code, and the frame end code follows the last row end code and finally ends the frame data of this frame. Note that although there is only one frame in this embodiment for illustration, those skilled in the art can reproduce this serial image format for the other frames of the image.

Method

Figure 2:
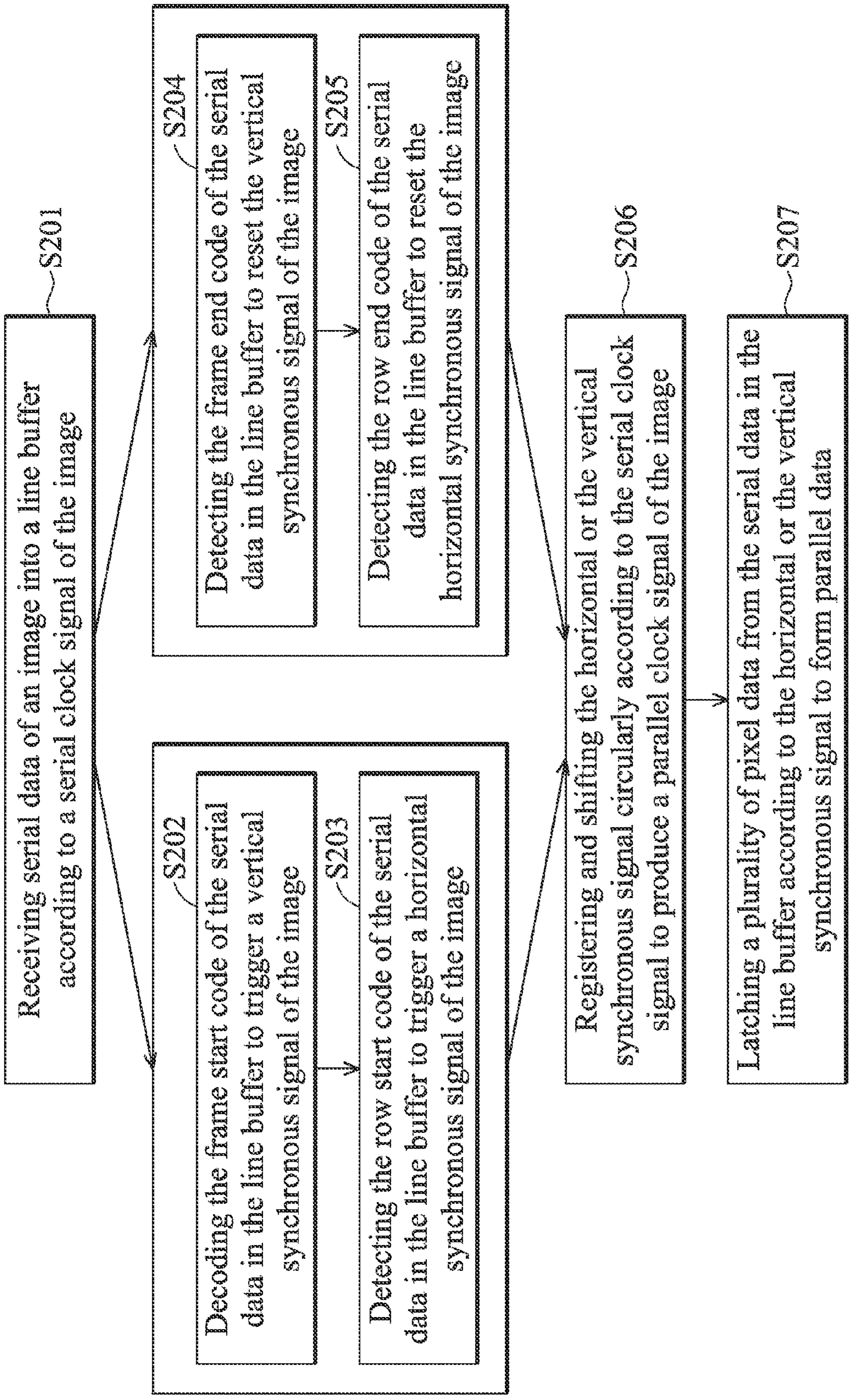
FIG. 2 is a flow chart of the method for converting image data from serial to parallel according to an embodiment of the present invention.

FIG. 2 is a flow chart of the method 200 for converting image data from serial to parallel according to an embodiment of the present invention. The step S201 of the method 200 receives serial data of an image (for example, the image data shown in FIG. 1) into a line buffer (302, shown later in FIG. 3) according to a serial clock signal of the image, wherein the serial data at least comprises the frame start code, the row start code, the row end code and the frame end code, which have been fully described previously. Then the step S202 detects the frame start code of the serial data in the line buffer (302) to trigger a vertical synchronous signal ("VSYNC" for short, shown latter in FIG. 3) of the image. The step S203 detects the row start code of the serial data in the line buffer (302) to trigger a horizontal synchronous signal of the image ("HSYNC" for short, shown latter in FIG. 3). The step S204 detects the frame end code of the serial data in the line buffer (302) to reset the vertical synchronous signal of the image ("VSYNC" for short, shown latter in FIG. 3). The step S205 detects the row end code of the serial data in the line buffer (302) to reset the horizontal synchronous signal (HSYNC) of the image. The step S206 registers and shifts the horizontal or the vertical synchronous signal circularly (VSYNC or HSYNC) according to the serial clock signal to produce a parallel clock signal of the image. The step S207 latches a plurality of pixel data from the serial data in the line buffer (302) according to the horizontal or the vertical synchronous signal (VSYNC or HSYNC) to form parallel data. The method 200 will be further discussed below in accordance with FIG. 3.

Apparatus

Figure 3:
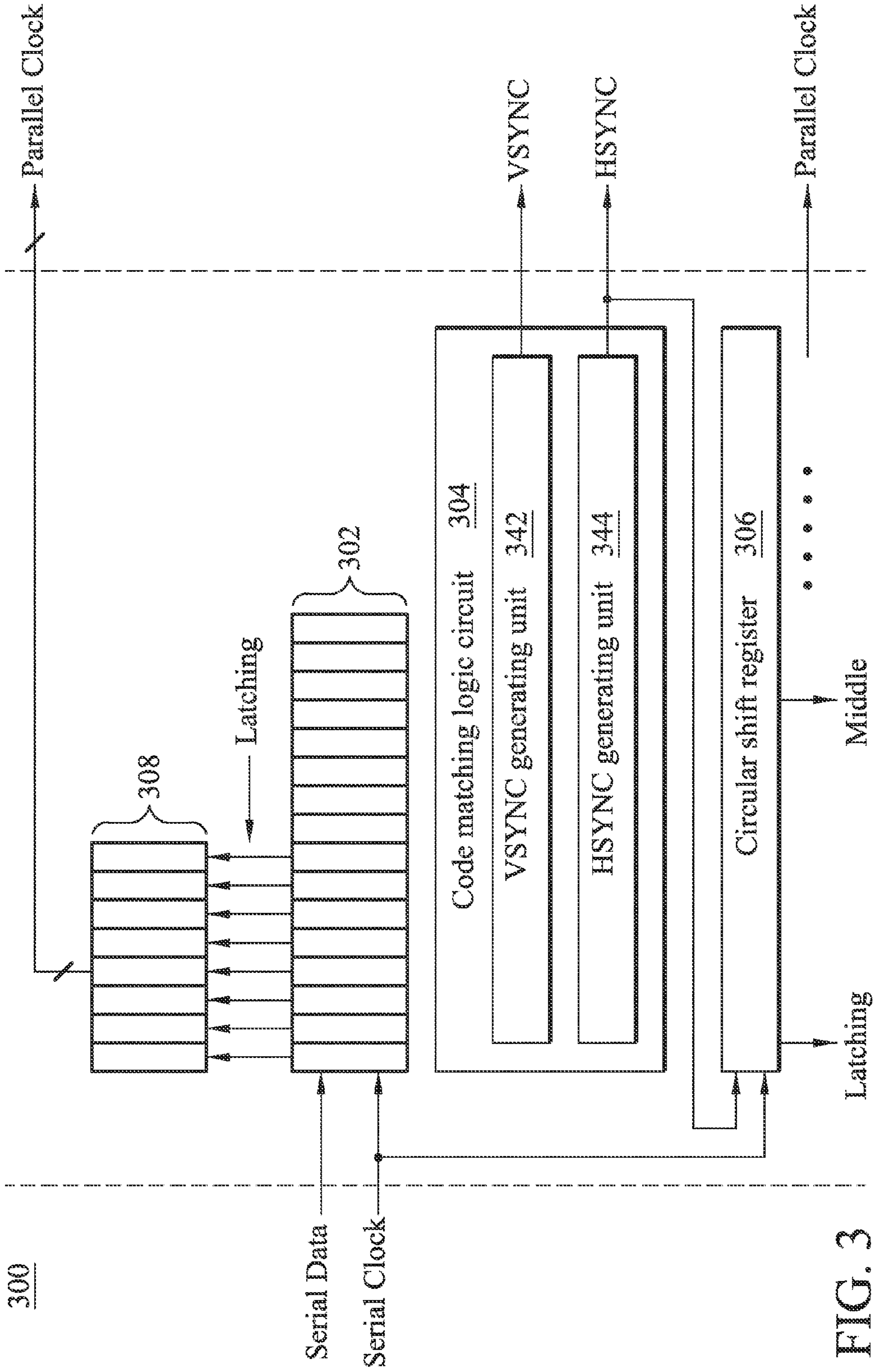
FIG. 3 is a schematic diagram of an apparatus for converting image data from serial to parallel according to an embodiment of the present invention.

FIG. 3 is a schematic diagram of an apparatus 300 for converting image data from serial to parallel according to an embodiment of the present invention. The apparatus 300 is used, for example, in a data receiver, and used to perform the steps of the method 200 introduced previously to convert data from serial to parallel. The apparatus 300 at least comprises a line buffer 302, a code matching logic circuit 304, a circular shift register 306 and a latching circuit 308.

Referring to FIGS. 1 and 3, the line buffer 302 is used to receive serial data and a serial clock signal of an image, for example, from a data transmitter (not shown). The serial data, which, for example, comprises the plurality of frame start codes (labeled as "Frame start" in FIG. 1), the plurality of frame end codes (labeled as "Frame end" in FIG. 1), the plurality of row start codes (all labeled as "Row start" in FIG. 1), the row end codes (all labeled as "Row end" in FIG. 1) and the plurality of pixel data (all labeled as "Data" in FIG. 1, and each has 8 bits, hereinafter, for example), are sequentially stored into the line buffer 302 bit by bit according to the timing of the serial clock signal, which is also from the data transmitter.

As shown in FIG. 3, the code matching logic circuit 304 is coupled to the line buffer 302. In order to generate a vertical synchronous signal VSYNC and a horizontal synchronous signal HSYNC for outputting data in parallel, the code matching logic circuit 304 further comprises a vertical synchronous signal generating unit ("VSYNC generating unit" for short) 342 and a horizontal synchronous signal generating unit ("HSYNC generating unit" for short) 344. The VSYNC generating unit 342 is used for generating the VSYNC signal of the image, while the HSYNC generating unit 344 is used for generating the HSYNC signal of the image. The VSYNC generating unit 342 and the HSYNC generating unit 344 will be further described respectively in accordance with FIGS. 4 and 5 below.

Figure 4:
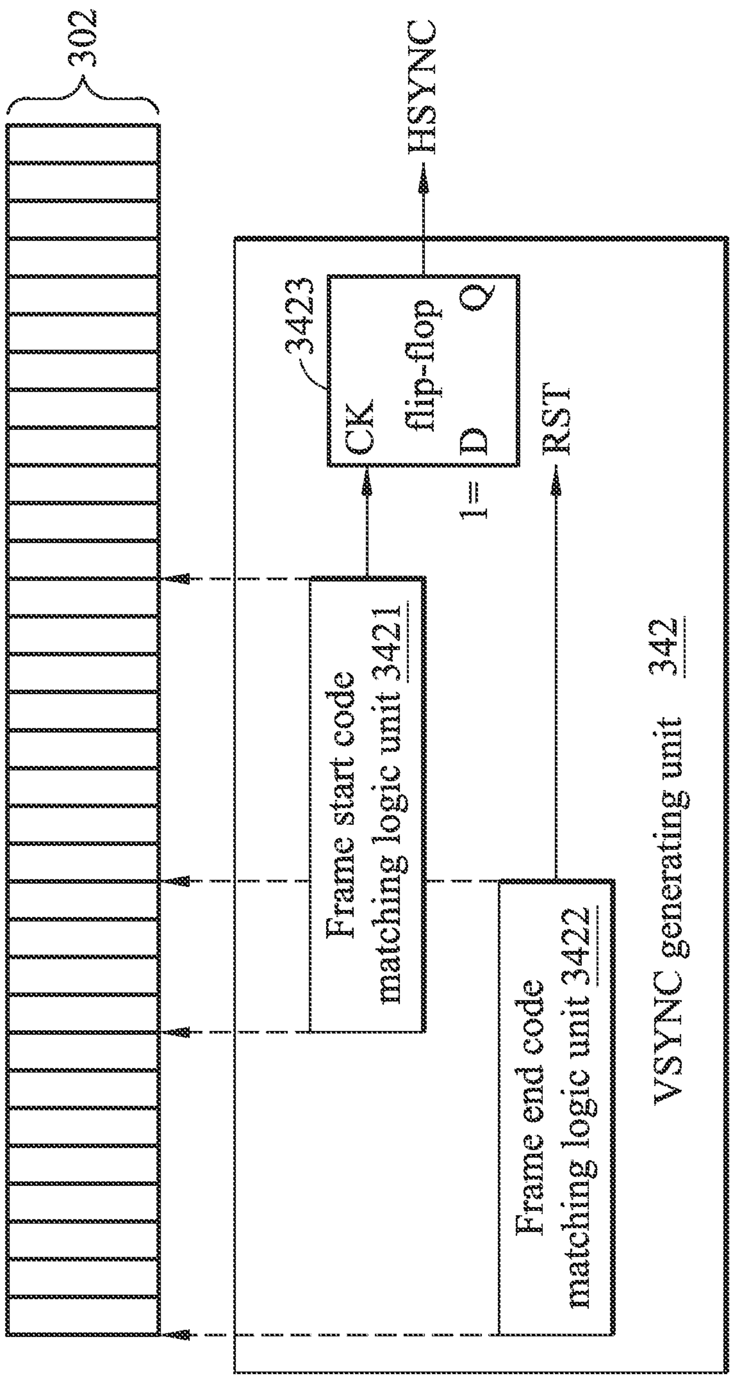
FIG. 4 is a schematic diagram of the VSYNC generating unit 342 of the present invention.

FIG. 4 is a schematic diagram of the VSYNC generating unit 342 of the embodiment of the present invention. In an embodiment, for example, the VSYNC generating unit 342 may further comprise a frame start code matching logic unit 3421, a frame end code matching logic unit 3422, and a flip-flop 3423. In this embodiment, the flip-flop 3423 is a D-type flip-flop ("DFF" for short), which has an input pin Q (preset to be 1, hereinafter), a clock pin CK, an output pin Q and a reset pin RST. The frame start code matching logic unit 3421 is used to detect the frame start code ("Frame start") of the serial data in the line buffer 302, for example, by comparing the received data to a predetermined frame start code to check if they match to each other, and, when detecting the frame start code ("Frame start"), to enable the clock pin CK of the DFF 3423. The frame end code matching logic unit 3422 is used to detect the frame end code ("Frame end") of the serial data in the line buffer 302, for example, by comparing the received data to a predetermined frame end code to check if they match to each other, and, when detecting that the frame end code ("Frame end"), to reset the DFF 3423 through the reset pin RST. Specifically, in the embodiment as shown in FIGS. 1 and 4, each pixel data ("Data") has 8 bits, and each of the frame start code ("Frame start") and the frame end code ("Frame end") has 12 bits. Thus, the frame start code matching logic unit 3421 is coupled to the 9th-20th bits of the line buffer 302 for detecting the frame start code, and the frame end code matching logic unit 3422 is coupled to the 1st-12th bits of the line buffer 302 for detecting the frame end code. Consequently, the VSYNC signal rises to a high level (i.e., "1") when the frame start code ("Frame start") is detected from the line buffer 304, and falls to a low level (i.e., "0") when the frame end code ("Frame end") is detected from the line buffer 304. Those skilled in the art can appropriately design the size and the value for the frame start code ("Frame start") and the frame end code ("Frame end") according to the present invention.

Figure 5:
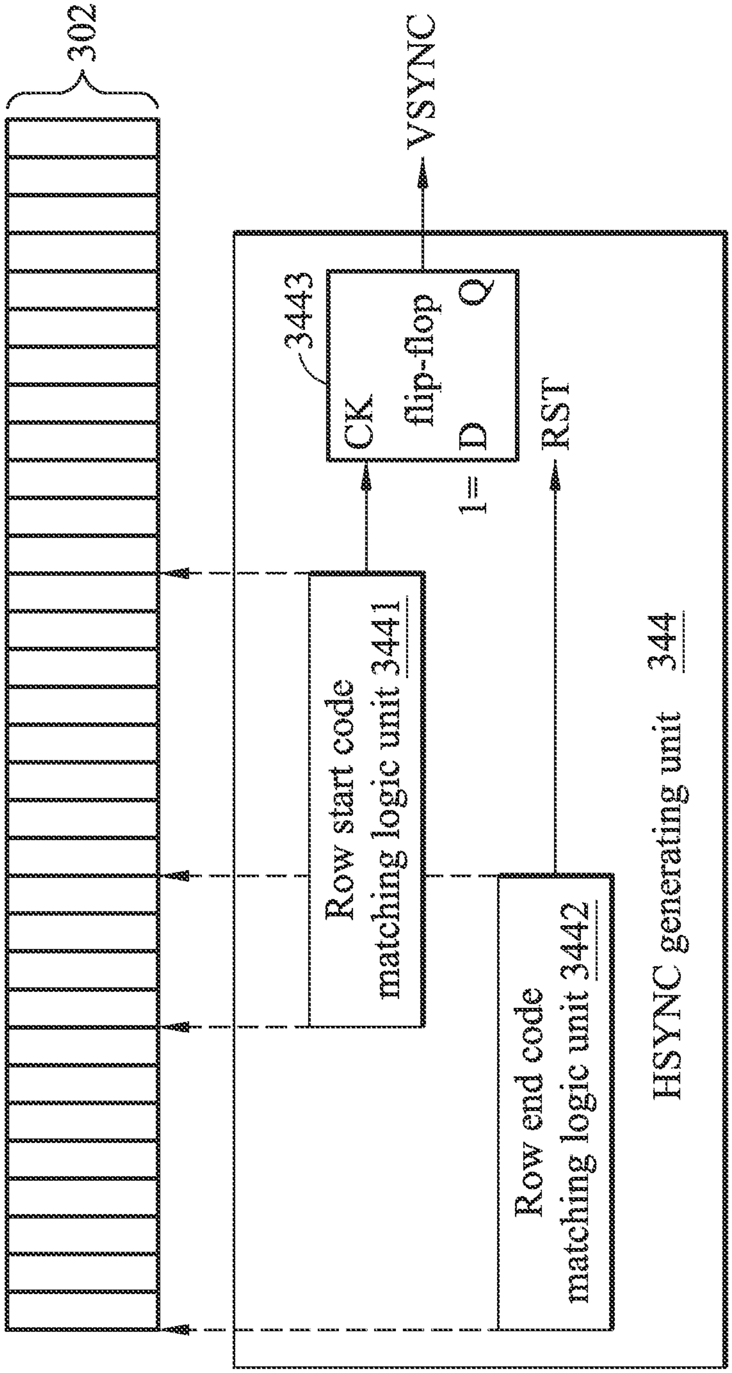
FIG. 5 is a schematic diagram of the HSYNC generating unit 344 of the present invention.

FIG. 5 is a schematic diagram of the HSYNC generating unit 344 of the embodiment of the present invention. In an embodiment, for example, the HSYNC generating unit 344 may further comprise a row start code matching logic unit 3441, a row end code matching logic unit 3442, and a flip-flop 3443. In this embodiment, the flip-flop 3443 is a D-type flip-flop ("DFF" for short), which has an input pin Q (preset to be 1, hereinafter), a clock pin CK, an output pin Q and a reset pin RST. The row start code matching logic unit 3441 is used to detect the row start code ("Row start") of the serial data in the line buffer 302, for example, by comparing the received data to a predetermined row start code to check if they match to each other, and, when detecting that the row start code ("Row start"), to enable the clock pin CK of the DFF 3443. The row end code matching logic unit 3442 is used to detect the row end code ("Row end") of the serial data in the line buffer 302, for example, by comparing the received data to a predetermined row end code to check if they match to each other, and, when detecting that the row end code ("Row end"), to reset the DFF 3443 through the reset pin RST. Specifically, in the embodiment as shown in FIGS. 1 and 5, each pixel data ("Data") has 8 bits, and each of the row start code ("Row start") and the row end code (Row end") has 12 bits. Thus, the row start code matching logic unit 3441 is coupled to the 9th-20th bits of the line buffer 302 for detecting the row start code, and the row end code matching logic unit 3442 is coupled to the 1st-12th bits of the line buffer 302 for detecting the row end code. Consequently, the HSYNC signal rises to a high level (i.e., "1") when the row start code ("Row start") is detected from the line buffer 304, and falls to a low level (i.e., "0") when the row end code ("Row end") is detected from the line buffer 304. Those skilled in the art can appropriately design the size and the value for the row start code ("Row start") and the frame end code ("Row end") according to the present invention.

Please refer to FIG. 3. The circular shift register 306 is coupled to the code matching logic circuit 304 to receive the HSYNC and/or the VSYNC signals, and, for example, is coupled to the data transmitter (not shown) to receive the serial clock signal. The circular shift register 306 is used for circularly registering and shifting the HSYNC or the VSYNC signal according to the timing of the serial clock signal, in order to produce a parallel clock signal of the image. In an embodiment, when a pixel in the image has 8-bit data, the circular shift register 306 should be an 8-bit circular shift register, for example, having eight S-R (or J-K or other type) flip-flops coupled in series. When the 8-bit circular shift register 306 detects the rising edge of the HSYNC (or VSYNC), it has the most significant bit (MSB) "1000000" stored therein, where the first bit is one, and the other bits are zero. Then, the stored data is sequentially shifted, according to the timing of the serial clock signal, from "10000000", then "01000000", then "00100000", . . . , and finally to the least significant bit (LSB) "00000001", and then starts over from "10000000". In a preferred embodiment, the circular shift register 306 outputs a middle signal (labeled as "Middle"), for example, to a logic gate (not shown), to generate a pulse as the parallel clock at the time when the value "1" registered in circular shift register 306 is being shifted from the fourth bit to the fifth bit (i.e., from "00010000" to "00001000"). The purpose of the preferred embodiment is to obtain a parallel clock signal which has each pulse rising right in the midst of each pixel data for preventing data transmission errors. However, the description of the preferred embodiment is only for illustration, and shall not be limited.

Please refer to FIG. 3. The latching circuit 308 is coupled to the line buffer 304, and, in an embodiment, further coupled to the circular shift register 306. In this embodiment, the circular shift register 306 may send a latching signal (labeled as "Latching" in FIG. 3) to the latching circuit 308 when the circular shift register 306 registers the most significant bit (MSB) "1000000" therein. Then, according to the latching signal based on the HSYNC (or the VSYNC) signal, the latching circuit 308 latches a plurality of pixel data (for example, 8 bits pixel data as shown in FIGS. 4 and 5) from the serial data in the line buffer 304, and collectively outputs the pixel data as the parallel data.

With the method or the apparatus of the embodiments of the present invention, the serial data of the image accompanied with the serial clock signal will be successfully converted into the parallel data accompanied with the parallel signal, the HSYNC signal and the VSYNC signal. Since the present invention does not require any additional or external sampling clock signal for sampling or latching data, the disadvantage of the un-synchronization between the sampling clock signal and the serial clock signal in the prior art can be effectively prevented.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for converting image data from serial to parallel, comprising steps of:

receiving serial data of an image into a line buffer according to a serial clock signal of the image, wherein the serial data at least comprises a frame start code, and a row start code;

detecting the frame start code of the serial data in the line buffer to trigger a vertical synchronous signal of the image; and detecting the row start code of the serial data in the line buffer to trigger a horizontal synchronous signal of the image.

2. The method as claimed in claim 1, when the serial data further comprises a row end code and a frame end code, further comprising:

detecting the frame end code of the serial data in the line buffer to reset the vertical synchronous signal of the image; and detecting the row end code of the serial data in the line buffer to reset the horizontal synchronous signal of the image.

3. The method as claimed in claim 1, further comprising:

registering and shifting the horizontal or the vertical synchronous signal circularly according to the serial clock signal to produce a parallel clock signal of the image; and latching a plurality of pixel data from the serial data in the line buffer according to the horizontal or the vertical synchronous signal to form parallel data.

4. A method for converting image data from serial to parallel, comprising steps of:

receiving serial data of an image into a line buffer according to a serial clock signal of the image, wherein the serial data at least comprises:

a frame start code, for indicating that frame data of a frame of an image has started;

a first row start code, following the frame start code, for indicating that the first row data of a first row of the frame of the image has started;

a last row start code, for indicating that last row data of a last row of the frame of the image has started; and a frame end code, for indicating that the frame data of the frame of the image has ended;

a first row end code, following the first row data and being followed by a second row start code, for indicating that the first row data of the first row of the frame of the image has ended; and a last row end code, being followed by the frame end code, for indicating that the last row data of the last row of the frame of the image has ended;

detecting the frame start code of the serial data in the line buffer to trigger a vertical synchronous signal of the image; and detecting the row start code of the serial data in the line buffer to trigger a horizontal synchronous signal of the image.

5. An apparatus for converting image data from serial to parallel, comprising:

a line buffer, for receiving serial data of an image-according to a serial clock signal of the image, wherein the serial data at least comprises a frame start code, and a row start code; and a code matching logic circuit, coupled to the line buffer, further comprising:

a vertical synchronous signal generating unit for detecting the frame start code of the serial data in the line buffer to trigger a vertical synchronous signal of the image; and a horizontal synchronous signal generating unit for detecting the row start code of the serial data in the line buffer to trigger a horizontal synchronous signal of the image.

6. The apparatus as claimed in claim 5, when the serial data further comprises a frame end code, wherein the vertical synchronous signal generating unit is further used for detecting the frame end code of the serial data in the line buffer to reset the vertical synchronous signal of the image.

7. The apparatus as claimed in claim 5, when the serial data further comprises a row end code, wherein the horizontal synchronous signal generating unit is further used for detecting the row end code of the serial data in the line buffer to reset the horizontal synchronous signal of the image.

8. The apparatus as claimed in claim 5, further comprising:

a circular shift register, coupled to the code matching logic circuit, for registering and shifting the horizontal or the vertical synchronous signal circularly according to the serial clock signal to produce a parallel clock signal of the image, and a latching circuit, coupled to the line buffer, for latching a plurality of pixel data from the serial data in the line buffer according to the horizontal or the vertical synchronous signal to form parallel data.

* * * * *